(12) United States Patent
Niederberger et al.

(10) Patent No.: US 11,889,252 B2
(45) Date of Patent: Jan. 30, 2024

(54) METHOD AND APPARATUS FOR BALANCING DETECTION SENSITIVITY IN PRODUCING A DIFFERENTIAL SIGNAL

(71) Applicant: Knowles Electronics, LLC, Itasca, IL (US)

(72) Inventors: Mark Niederberger, Einsiedeln (CH); Thomas Gautschi, Zürich (CH); Michael Kuntzman, Chicago, IL (US); Mohsin Nawaz, Lombard, IL (US); Mohammad Shajaan, Copenhagen (DK); Christian Lillelund, Fredensborg (DK)

(73) Assignee: Knowles Electronics, LLC, Itasca, IL (US)

( * ) Notice: Subject to any disclaimer, the term of this patent is extended or adjusted under 35 U.S.C. 154(b) by 71 days.

(21) Appl. No.: 17/317,832

(22) Filed: May 11, 2021

(65) Prior Publication Data
US 2022/0369013 A1  Nov. 17, 2022

(51) Int. Cl.
*H04R 1/08* (2006.01)
*H03F 3/183* (2006.01)
(Continued)

(52) U.S. Cl.
CPC ............ *H04R 1/083* (2013.01); *H03F 3/183* (2013.01); *H04R 1/04* (2013.01); *H04R 1/265* (2013.01);
(Continued)

(58) Field of Classification Search
CPC .......... H04R 1/083; H04R 1/04; H04R 1/265; H04R 3/00; H04R 19/04; H04R 29/004;
(Continued)

(56) References Cited

U.S. PATENT DOCUMENTS

| 9,503,814 B2 | 11/2016 | Schultz et al. |
| 9,641,137 B2 | 5/2017 | Duenser et al. |

(Continued)

FOREIGN PATENT DOCUMENTS

| WO | 2018099655 A1 | 6/2018 |
| WO | 2019246151 A1 | 12/2019 |
| WO | 2019246152 A1 | 12/2019 |

OTHER PUBLICATIONS

Jennings et al., U.S. Appl. No. 16/906,998, U.S. Patent and Trademark Office, filed Jun. 19, 2020.
(Continued)

*Primary Examiner* — Carolyn R Edwards
*Assistant Examiner* — Kuassi A Ganmavo
(74) *Attorney, Agent, or Firm* — Loppnow & Chapa

(57) ABSTRACT

A microphone device, an interface circuit and method are provided for managing a potential difference in sensitivity to a detected environmental stimulus associated with a sensor arrangement, where multiple electrical signals forming a differential signal can be produced, and the multiple electrical signals can be better balanced. Such an interface circuit, which can be used within a microphone device includes a bias voltage generator having one or more bias output voltage terminals, where a respective one of one or more DC bias voltages is produced at each of the bias output voltage terminals, for being coupled to a pair of transduction elements of a sensor. The interface circuit further includes an amplifier circuit having a first input terminal coupled to a first one of the pair of output terminals of the sensor and having a second input terminal coupled to a second one of the pair of output terminals of the sensor, the amplifier circuit producing a differential output signal. The interface circuit still further includes a compensation circuit coupled to the amplifier circuit for producing a balance signal based on an output signal being produced by the amplifier circuit,
(Continued)

wherein the balance signal compensates for any difference in amplitude in the first and second electrical signals that are received by the amplifier circuit from the sensor.

23 Claims, 11 Drawing Sheets

(51) Int. Cl.
*H04R 29/00* (2006.01)
*H04R 1/04* (2006.01)
*H04R 19/04* (2006.01)
*H04R 3/00* (2006.01)
*H04R 1/26* (2006.01)
*B81B 7/00* (2006.01)

(52) U.S. Cl.
CPC ............... *H04R 3/00* (2013.01); *H04R 19/04* (2013.01); *H04R 29/004* (2013.01); *B81B 7/0006* (2013.01); *B81B 2201/0257* (2013.01); *H03F 2200/03* (2013.01); *H03F 2200/09* (2013.01); *H04R 2201/003* (2013.01)

(58) Field of Classification Search
CPC ............... H04R 2201/003; H03F 3/183; H03F 2200/09; H04F 2200/03; B81B 7/006; B81B 2201/0257
See application file for complete search history.

(56) References Cited

U.S. PATENT DOCUMENTS

| | | | |
|---|---|---|---|
| 10,153,740 B2 * | 12/2018 | Albers | H03F 3/45475 |
| 10,523,162 B2 | 12/2019 | Albers et al. | |
| 10,939,214 B2 | 3/2021 | Kuntzman et al. | |
| 2007/0163815 A1 * | 7/2007 | Ungaretti | G01P 15/131 178/18.06 |
| 2007/0163875 A1 * | 7/2007 | Van Der Meer | G02B 26/005 204/247.4 |
| 2008/0075306 A1 * | 3/2008 | Poulsen | H04R 19/005 381/59 |
| 2008/0192962 A1 * | 8/2008 | Halteren | H04R 1/222 381/170 |
| 2009/0110213 A1 * | 4/2009 | Holzmann | H04R 3/02 381/95 |
| 2011/0267212 A1 * | 11/2011 | Denison | G01D 5/24 341/122 |
| 2014/0176231 A1 * | 6/2014 | Spinella | G01P 15/125 327/538 |
| 2015/0110291 A1 | 4/2015 | Furst et al. | |
| 2015/0125003 A1 * | 5/2015 | Wiesbauer | B81C 1/00523 438/51 |
| 2016/0056776 A1 * | 2/2016 | Fröhlich | H03F 3/04 330/291 |
| 2019/0039884 A1 * | 2/2019 | Dehe | G01L 9/0041 |
| 2019/0356282 A1 * | 11/2019 | Froehlich | H03F 1/34 |
| 2019/0387326 A1 | 12/2019 | Hansen et al. | |
| 2020/0010315 A1 | 1/2020 | Tingleff et al. | |
| 2020/0112799 A1 | 4/2020 | Kuntzman et al. | |
| 2020/0252728 A1 | 8/2020 | Niederberger | |
| 2020/0252729 A1 | 8/2020 | Mueller et al. | |

OTHER PUBLICATIONS

Mohammadi et al., U.S. Appl. No. 17/197,026, U.S. Patent and Trademark Office, filed Mar. 10, 2021.

Malandruccolo et al., U.S. Appl. No. 17/138,471, U.S. Patent and Trademark Office, filed Dec. 30, 2020.

Malandruccolo et al., U.S. Appl. No. 17/138,487, U.S. Patent and Trademark Office, filed Dec. 30, 2020.

* cited by examiner

METHOD AND APPARATUS FOR BALANCING DETECTION SENSITIVITY IN PRODUCING A DIFFERENTIAL SIGNAL

FIELD OF THE DISCLOSURE

The present disclosure is directed to managing a potential difference in sensitivity to a detected environmental stimulus associated with a sensor arrangement, where multiple electrical signals forming a differential signal can be produced, and balancing the same. In at least some instances, the multiple electrical signals are each associated with a respective transduction element having an associated sensitivity to the corresponding environmental stimulus.

BACKGROUND

Microphones and other known sensors generally comprise a transduction element that generates an electrical signal representing a sensed environmental condition, like sound, and a signal conditioning circuit and/or interface circuit, like an application specific integrated circuit (ASIC). These components are typically integrated in a package referred to as a sensor assembly. Some sensors include one or more transduction elements that output differential signals representing the sensed condition. Such sensors can include two capacitive microelectromechanical systems (MEMS) motors connected to a common node and/or a pseudo common node, such as in instances involving a dual charge pump, and to differential inputs of an amplifier circuit. In some instances, a pair of sensors can be organized and arranged so that they each produce a respective electrical signal that is approximately 180 degrees out of phase. In some microphones and other sensors, the sensor signals input to the ASIC should be balanced to better meet performance specifications. This often includes the detected amplitude by each of a pair of sensors having as close to a similar amplitude when detecting the same condition being sensed. However the differential sensor signals may not be balanced, such as with respect to the amplitude of the individual signals being produced within the sensors, due to structural asymmetries and manufacturing tolerances.

The present inventor have recognized that it may be beneficial to be able to provide a compensation circuit capable of accounting for at least some of the imbalances that may potentially be present, where the compensation circuit can produce a conditioning signal and/or a balance signal, which can be superimposed on the common node, so that the signals being produced within the sensor which contributes to the differential signal that could be applied to the input of an amplifier are better balanced, where being better balanced includes individual component signals respectively associated with the multiple transduction elements that are closer to having the same or similar amplitude, but with an inverted phase.

SUMMARY

The present application provides a microphone device. The microphone device includes a sensor having a pair of transduction elements organized and arranged for producing first and second electrical signals, which are substantially 180 degrees out of phase and which are each associated with a respective one of a pair of output terminals. Each one of the pair of transduction elements has a potential difference in sensitivity to a detected stimulus, which can manifest in the first and second electrical signals that are being produced by the sensor having a difference in amplitude. The microphone device further includes an interface circuit including a bias voltage generator, that has one or more bias output voltage terminals, where a respective one of one or more DC bias voltages is produced at each of the bias output voltage terminals, which are coupled to the pair of transduction elements of the sensor. The interface circuit further includes an amplifier circuit having a first input terminal coupled to a first one of the pair of output terminals of the sensor and having a second input terminal coupled to a second one of the pair of output terminals of the sensor, the amplifier circuit producing at a pair of output terminals a differential output signal. The interface circuit still further includes a compensation circuit coupled to the amplifier circuit for producing a balance signal based on an output signal being produced by the amplifier circuit, wherein the balance signal compensates for any difference in amplitude in the first and second electrical signals that are received by the amplifier circuit from the sensor.

According to another possible embodiment, An interface circuit for interfacing with a sensor having a pair of transduction elements is provided. The pair of transduction elements are organized and arranged for producing first and second electrical signals, which are substantially 180 degrees out of phase and which are each associated with a respective one of a pair of output terminals. Each one of the pair of transduction elements has a potential difference in sensitivity to a detected stimulus, which can manifest in the first and second electrical signals that are being produced by the sensor having a difference in amplitude. The interface circuit includes a bias voltage generator having one or more bias output voltage terminals, where a respective one of one or more DC bias voltages is produced at each of the bias output voltage terminals, which are adapted to be coupled to the pair of transduction elements of the sensor, and an amplifier circuit having a first input terminal adapted to be coupled to a first one of the pair of output terminals of the sensor. The interface circuit further includes a second input terminal adapted to be coupled to a second one of the pair of output terminals of the sensor, the amplifier circuit producing at a pair of output terminals a differential output signal. The interface still further includes a compensation circuit coupled to the amplifier circuit for producing a balance signal based on an output signal being produced by the amplifier circuit, wherein the balance signal compensates for any difference in amplitude in the first and second electrical signals that are adapted to be received by the amplifier circuit from the sensor.

According to another possible embodiment, a method is provided. The method includes producing one or more DC bias voltages and supplying the produced DC bias voltages to a sensor, which includes a pair of transduction elements. A stimulus is detected by the sensor, where within the sensor the pair of transduction elements are organized and arranged for producing first and second electrical signals, which are substantially 180 degrees out of phase in response to the detected stimulus, where each one of the pair of transduction elements have a potential difference in sensitivity to the detected stimulus. A differential output signal is produced at a pair of output terminals of an amplifier circuit, where the differential output signal is based upon receipt of the first and second electrical signals from the sensor. A balance signal is determined by a compensation circuit, the balance signal being based on an output signal being produced by the amplifier circuit, where the balance signal compensates for any difference in amplitude in the first and second electrical signals that are received by the amplifier circuit from the sensor. The balance signal is then applied to the sensor.

These and other objects, features, and advantages of the present application are evident from the following description of one or more preferred embodiments, with reference to the accompanying drawings.

DETAILED DESCRIPTION

Figure 1:
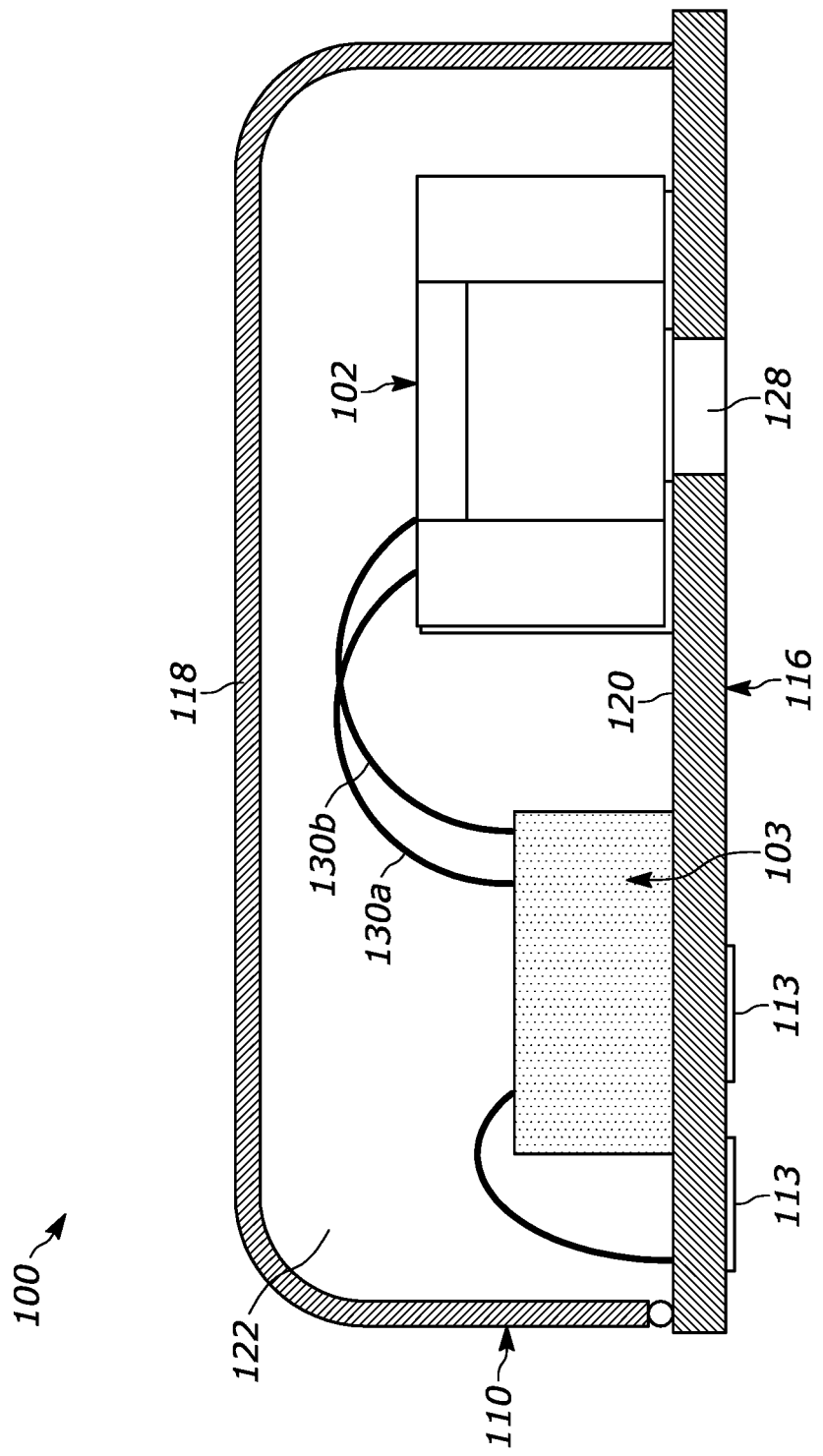
FIG. 1 is a cross sectional view of a sensor assembly.

While the present disclosure is susceptible of embodiment in various forms, there is shown in the drawings and will hereinafter be described presently preferred embodiments with the understanding that the present disclosure is to be considered an exemplification of the invention and is not intended to limit the invention to the specific embodiments illustrated. One skilled in the art will appreciate that the elements in the drawings are illustrated for simplicity and clarity and therefore may have not necessarily been drawn to scale, and may not include some well-known features. For example, the dimensions of some of the elements in the drawings may be exaggerated relative to other elements with the intent to help improve understanding of the aspects of the embodiments being illustrated and described.

The present disclosure relates to sensor assemblies, electrical circuits for processing differential sensor signals, and methods of operating the same. The sensor assembly generally comprises one or more transduction elements that produce differential output signals substantially 180 degrees out of phase, but which can have different amplitudes due to purposeful asymmetries, manufacturing tolerances and/or other reasons. The sensor can be a capacitive, piezo or optical electro-acoustic transduction element among other known and future sensors configured to convert a sensed environmental condition into a corresponding electrical signal. Such sensors can be fabricated from microelectromechanical systems (MEMS) or some other known or future technology. In one implementation, the sensor is an acoustic sensor and the electrical circuit is a microphone signal processing circuit. In other implementations, the sensor is a non-acoustic sensor and the electrical circuit is a non-acoustic sensor signal processing circuit. Such other sensors include pressure, temperature, gas, vibration, and humidity sensors, among others.

In accordance with at least one embodiment a sensor assembly generally comprises a transducer and an electrical circuit disposed in a housing configured to interface with a host device. In FIG. 1, a cross sectional view of an exemplary sensor assembly 100 is illustrated. The sensor assembly 100 includes a transducer 102 coupled to an electrical circuit 103 disposed within a housing 110. The housing includes a base 116 and a cover 118 fastened to an upper surface 120 of the base. In some implementations, the housing shields the transducer and the electrical circuit located within the interior 122 of the housing from electromagnetic interference like RF noise. For this purpose, the cover can be metal or include a conductive portion electrically coupled to a conductive portion of the base. The housing can also include an electrical interface with contacts (e.g., supply, ground, data, clock, select, etc.) configured to interface with a host device. In FIG. 1, the host-interface is a surface-mount interface 113 located on an outer surface of the base 116 and is suitable for reflow soldering processes. In other embodiments, the host-interface can have some other form factor, like through-hole pins, and the interface can be located on another part of the housing.

In some sensor assemblies, like microphones, the housing includes an aperture (also called a "port") connecting an interior of the housing to the external environment. In FIG. 1, the port 128 is located on the base 116 in alignment with the transducer 102. In other sensors, the port can be on some other part of the housing, like the cover or sidewall. A port is not required in other sensor assemblies, like acoustic vibration sensors and accelerometers, among others.

In one embodiment, the sensor assembly is a microphone configured to generate an electrical signal representative of acoustic signals propagated through the atmosphere and detected by a transducer within the housing. In other embodiments, the sensor assembly is configured to generate an electrical signal representative of vibrations. For example, the sensor assembly can be configured to detect acoustic vibrations propagated through a person's body or an inanimate object. Other sensor assemblies can be configured to detect pressure, acceleration, humidity, or temperature, among other conditions. The transducer can be a capacitive, piezoelectric, optical or other transduction device. These and other transduction devices can be implemented as a microelectromechanical systems (MEMS) device or as some other known or future device.

The electrical circuit generally comprises a processing circuit configured to process the electrical signal produced by the transducer and to provide the processed signal at the host interface of the sensor assembly. In FIG. 1, the electrical circuit 103 is coupled to the transducer 102 via leads 130a and 130b and to contacts on the host-interface 113 via traces in the base for this purpose. The electrical circuit can obtain power, clock and other signals from contacts on the host-interface. In other implementations, the sensor assembly can include the transduction element and sensor signal processing circuit, but these elements are not necessarily disposed in or integrated within a housing.

Figure 2:
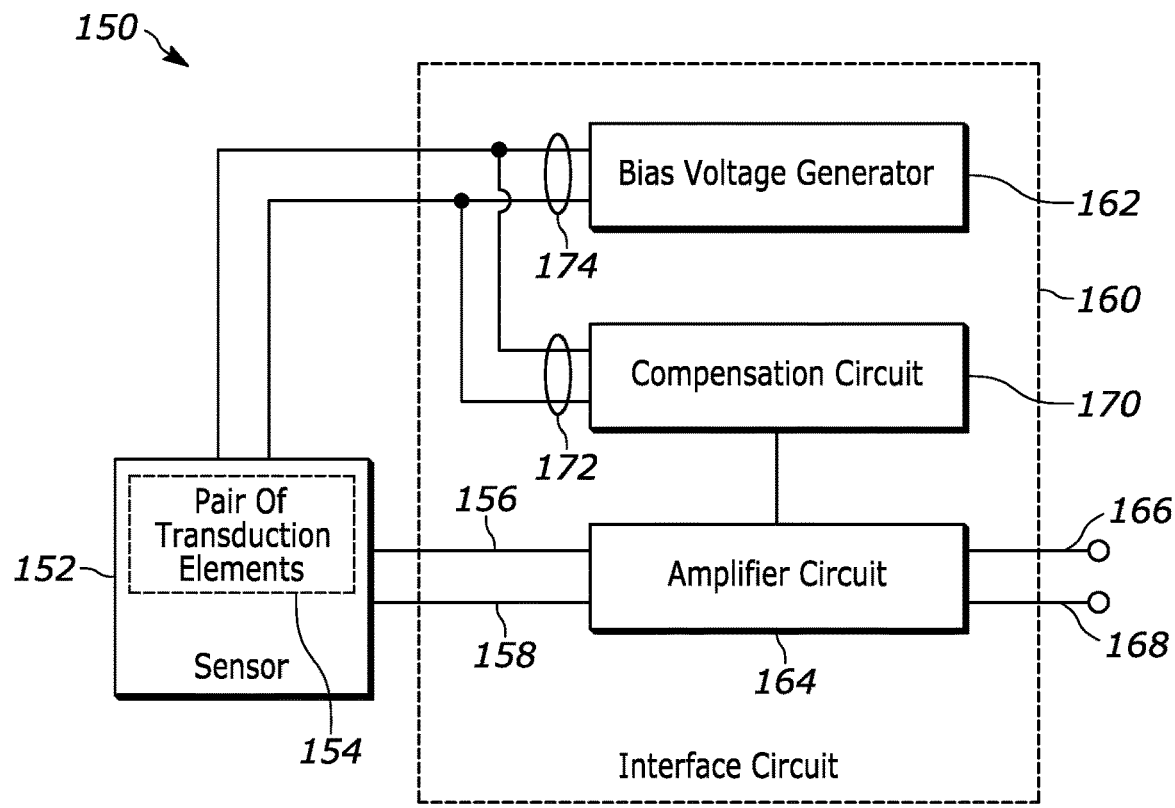
FIG. 2 is a block diagram of a sensor assembly, in accordance with at least one embodiment of the present application.

FIG. 2 illustrates a block diagram of a sensor assembly 150, in accordance with at least one embodiment of the present application. In the illustrated embodiment, the sensor assembly 150 includes a sensor 152 which can have a pair of transduction elements 154 organized and arranged for producing first and second electrical signals 156 and 158, which are substantially 180 degrees out of phase and which are each associated with a respective one of a pair of output terminals. Each one of the pair of transduction elements 154 has a potential difference in sensitivity to a detected stimulus, which can manifest in the first and second electrical signals 156 and 158 that are being produced by the sensor having a difference in amplitude. The microphone device further includes an interface circuit 160 including a bias voltage generator 162 that has one or more bias output voltage terminals 174, where a respective one of one or more DC bias voltages is produced at each of the bias output voltage terminals, which are coupled to the pair of transduction elements 154 of the sensor 152. The interface circuit 160 further includes an amplifier circuit 164 having a first input terminal coupled to a first one of the pair of output terminals of the sensor and having a second input terminal coupled to a second one of the pair of output terminals of the sensor, the amplifier circuit 164 producing at a pair of output terminals 166 and 168 a differential output signal. The interface circuit 160 still further includes a compensation circuit 170 coupled to the amplifier circuit 164 for producing a balance signal 172 based on an output signal being produced by the amplifier circuit 164, wherein the balance signal 172 compensates for any difference in amplitude in the first and second electrical signals 156 and 158 that are received by the amplifier circuit 164 from the sensor 152.

Figure 3:
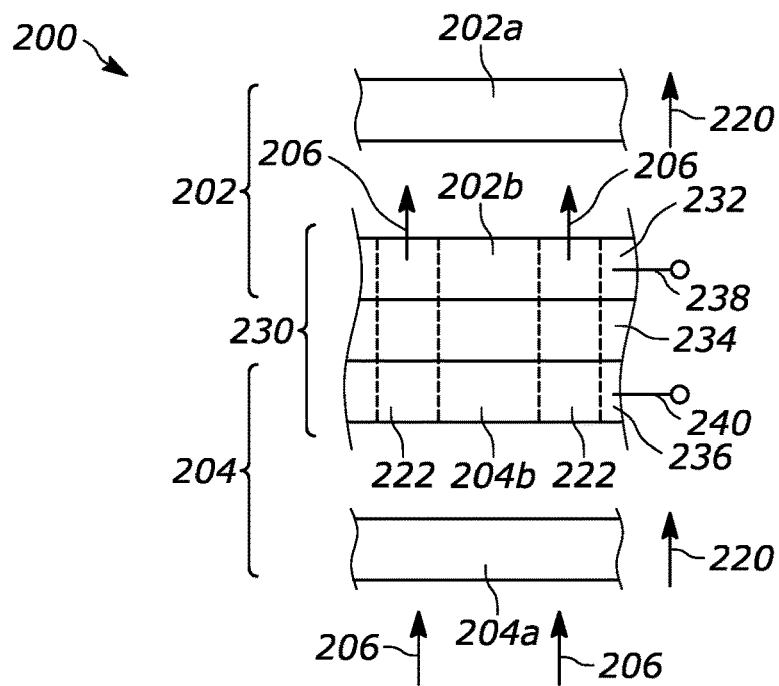
FIG. 3 is a partial plan diagram of a differential sensor including a respective orientation and arrangement of a pair of transducers in a stacked configuration.
Figure 4:
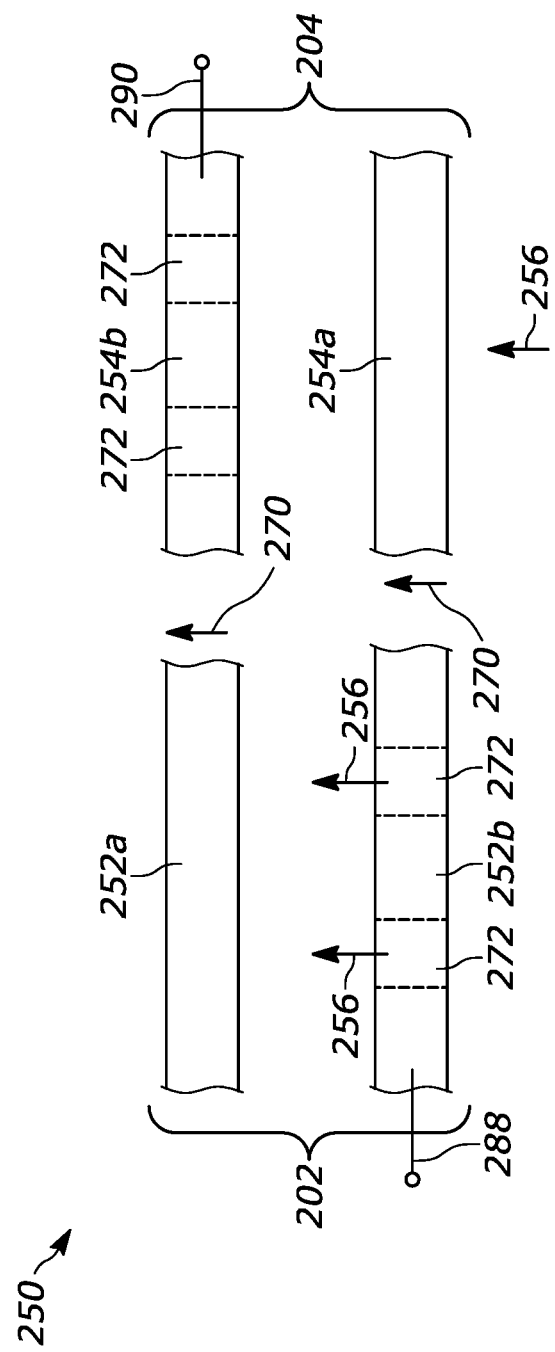
FIG. 4 is partial plan diagram of a differential sensor including a respective orientation and arrangement of a pair of transducers in a side-by-side configuration.

FIGS. 3 and 4 are each respectively associated with exemplary orientation and arrangement of at least a pair of transduction elements, which can be used to support a differential sensor, such as a differential MEMS. More specifically, FIG. 3 illustrates a partial cross sectional view 200 that corresponds to a pair of transduction elements 202 and 204 in an exemplary stacked configuration. Each of the transduction elements can include a back plate 202b and 204b and a diaphragm 202a and 204a, which can be commonly exposed to an external stimulus, such as a pressure wave 206 associated with an acoustic signal, which in turn can cause the diaphragm to move 220 relative to the back plate, and can cause a stored charge across the diaphragm and the associated back plate to have an associated change in voltage as the relative distance between the respective back plate and diaphragm changes.

One or more apertures 222 in the back plate can facilitate the effects of the pressure wave traversing the back plate and being perceived by the other one of the two diaphragms, which in turn can provide for a relative movement 220 of the diaphragm with respect to the associated back plate that is in an opposite direction, which in turn can manifest in a resulting change in an electrical signal being produced in the pair of transduction elements that is substantially 180 degrees out of phase relative to one another.

In the illustrated embodiment, the transduction elements are oriented and arranged so that the back plates 202b and 204b of each of the respective pair of transduction elements 202 and 204 at least partially share portions of the same associated structure. In the illustrated embodiment, the back plate 230 includes multiple layers including an insulator 234 that is sandwiched between a pair of separate conductors 232 and 236, where each one of the pair of conductors is associated with a respective one of the transduction elements. Each of the conductors can have a different associated bias voltage terminal 238 and 240 for supporting the coupling of a different one of multiple independent bias voltages, as well as for supporting the separate application of respective component portions of a balance signal, which can be used to better balance the resulting electrical signal being produced by each of the transduction elements.

FIG. 4 illustrates a partial cross sectional view 250, that corresponds to a pair of transduction elements 252 and 254 in an exemplary side by side configuration, where each of the transduction elements can include a back plate 252b and 254b, and a diaphragm 252a and 254a, which can be commonly exposed to an external stimulus, such as a pressure wave 256 associated with an acoustic signal, which in turn can cause the diaphragm 252a and 254a to move 270 relative to the back plate 252b and 254b, and can cause a stored charge across the diaphragm and the associated back plate to have an associated change in voltage as the relative distance between the respective back plate and diaphragm changes.

In such a side by side configuration it can be beneficial to reverse the position of the back plate relative to the diaphragm with respect to one of the two transduction elements, which form the pair.

One or more apertures 272 in the respective back plates can facilitate the effects of the pressure wave 256 traversing one or more of the back plates and being perceived by any one of the two diaphragms that is located on an opposite side of the corresponding back plate relative to the source of acoustic signal, which in turn can provide for a relative movement 270 of the diaphragm with respect to the associated back plate that is in an opposite direction. This can in turn manifest in a resulting change in an electrical signal being produced in the pair of transduction elements that is substantially 180 degrees out of phase relative to one another.

Each of the back plates 252b and 254b can have a different associated bias voltage terminal 288 and 290 for supporting the coupling of a different one of multiple independent bias voltages, as well as for supporting the separate application of respective component portions of a balance signal, which can be used to better balance the resulting electrical signal being produced by each of the transduction elements.

As previously noted, a balance signal can be used to separately compensate for any difference in the electrical signals being produced by the respective transductions elements of the sensor to account for any potential difference in sensitivity to a detected stimulus. Such a difference or imbalance can be the result of manufacturing tolerances and/or purposefully present structural asymmetries, that may be present in the separate structures forming the pair of transduction elements.

Figure 5:
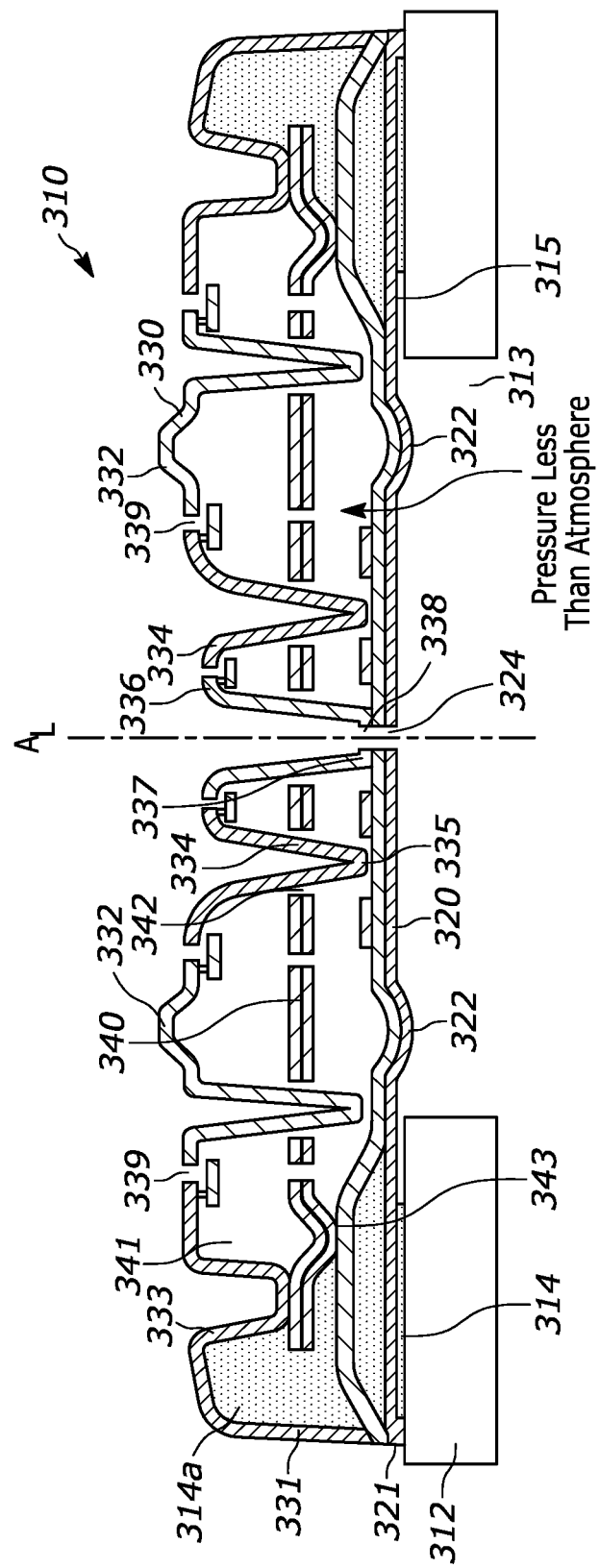
FIG. 5 is a cross sectional plan view of a differential sensor including a pair of transducers in a stacked configuration having asymmetric diaphragms.

FIG. 5 illustrates a MEMS motor from previously filed US published patent application no. 2020/0112799, Kuntzman et al., assigned to Knowles Electronics, LLC, the teachings and contents of which are incorporated herein by reference. More specifically, FIG. 5 illustrates a more detailed side cross-section view of a further exemplary acoustic transducer 310, including a pair of transduction elements in a stacked configuration or arrangement. The acoustic transducer 310 may include, for example, a MEMS acoustic transducer for use in a MEMS microphone assembly or a MEMS pressure sensor. The acoustic transducer 310 is configured to generate electrical signals in response to acoustic signals or atmospheric pressure changes. As discussed below, asymmetries in the corresponding structures can be the result of purposefully present structures, such as posts, that can be associated with one of the two diaphragms, which in turn can manifest in the presence of unwanted imbalances in the corresponding electrical signals being produced in the response to the detected stimulus.

Relative to the specific structure shown in FIG. 5, the acoustic transducer 310 includes a substrate 312 (e.g., a silicon, glass or ceramic substrate) defining a first opening 313 therein. A support structure 314 is disposed over the substrate 312 and defines a second opening 315 therethrough which may be axially aligned with the first opening 313 so as to define at least a portion of an acoustic path of the acoustic transducer 310. In various embodiments, the support structure 314 may be formed from glass (e.g., glass having a phosphorus content). In some embodiments, the second opening 315 may have the same cross-section (e.g., diameter) as the first opening 313. In other embodiments, the second opening 315 may have a larger or smaller cross-section relative to the first opening 313.

The acoustic transducer 310 includes a bottom or first diaphragm 320 and a top or second diaphragm 330 spaced apart from the first diaphragm 320 such that a cavity 341 having a pressure lower than atmospheric pressure, for example, in a range of 1 mTorr to 10 Torr, or 1 mTorr to 1 Torr, is formed therebetween. A back plate 340 is located between the first diaphragm 320 and the second diaphragm 330 in the cavity 341. The back plate 340 is anchored on the first diaphragm 320 and the second diaphragm 330 is anchored on the back plate 340 at corresponding edge anchors 343 and 333, respectively. The edge anchors 343 and 333 are radially offset from each other. It should be appreciated that the components included in the acoustic transducer 310 may have circular cross-sections. At least a portion of the first diaphragm 320, for example, proximate to a first perimetral edge 321 of the first diaphragm 320 and radially inwards thereof; is disposed on the support structure 314. The first perimetral edge 321 of the first diaphragm 320 extends beyond a perimeter of the support structure 314 and is coupled to the substrate 312. Furthermore, a second perimetral edge 331 of the second diaphragm 330 extends towards the first perimetral edge 321 and is coupled thereto. As shown in FIG. 5, a portion 314a of the support structure 314 may be embedded in a volume between the edge anchors 333 and 343 and the second perimetral edge 331 of the second diaphragm 330.

Surfaces of each of the first diaphragm 320 and the second diaphragm 330 located outside the cavity 341 are exposed to atmosphere, for example, atmospheric air. A plurality of apertures 342 are defined in the back plate 340 such that a portion of the cavity 341 located between the first diaphragm 320 and the back plate 340 is connected to a second portion of the cavity 341 between the second diaphragm 330 and the back plate 340. While shown as including a single layer, in various embodiments, the second diaphragm 330 may also include a plurality of layers. For example, the second diaphragm 330 may include a first insulative layer (e.g., a silicon nitride layer), and a second conductive layer (e.g., a polysilicon layer).

To increase compliance, a first corrugation 322 and a second corrugation 332 are formed on the first diaphragm 320 and the second diaphragm 330, respectively. The first and second corrugations 322 and 332 protrude outwardly from the diaphragms 320 and 330, respectively in a direction away from the back plate 340, and are circumferentially positioned about a longitudinal axis AL of the acoustic transducer. More than one corrugation may be defined in the first and second diaphragms 320, 330. In some implementations, the first and second corrugation 322 and 332 may be more proximate to outer edges of the first and second diaphragms 320 and 330 then a center point thereof. In other embodiments, the first and/or second corrugation 322 and 332 may be located more proximate to the longitudinal axis AL than the outer edge of the first and second diaphragm 320 and 330 or equidistant therefrom. Furthermore, the first and second corrugation 322 and 332 may be axially aligned or may be axially offset from each other relative to a longitudinal axis AL of the acoustic transducer 310. In various embodiments, the corrugations 322 and 332 may have a height in a range of 0.5 microns to 5 microns (e.g., 0.5, 1, 2, 3, 4 or 5 microns inclusive of all ranges and values therebetween), and a spacing measured between flat areas of the diaphragms 320, 330 is in a range of 1-15 microns (e.g., 1, 3, 5, 7, 9, 12, 14 or 15 microns inclusive of all ranges and values therebetween).

In order to prevent collapse of the first and second diaphragms 320 and 330 due to the large pressure differential between atmospheric air and the low pressure in the cavity 341, the second diaphragm 330 may include a purposeful asymmetry in the form of a plurality of posts 334, which can extend therefrom towards the first diaphragm 320 through corresponding apertures 342 of the back plate 340. Tips 335 of the posts 334 can be positioned proximate to the first diaphragm 320 and spaced apart therefrom such that the post 334 is unanchored. When one or both of the diaphragms 320 and 330 vibrate or are otherwise displaced (e.g., bent) towards each other, the one or more of the tips 335 of the posts 334 contact an inner surface of the first diaphragm 320 located within the cavity 341 so as to restrict further displacement of the diaphragms 320, 330 towards each other, at least, at locations where the post 334 is positioned, and can thereby help to prevent the collapse of the diaphragms 320, 330. In various embodiments, the acoustic transducer 310 may have an average compliance in a region of the diaphragms 320 and 330 which can be more than 8 times an average compliance of a similar acoustic transducer that does not include outward facing corrugations and the unanchored posts. In some embodiments, a tip of each of the posts 334 may be coupled to the first diaphragm 320. The acoustic transducer 310 may include any number of posts 334, for example, in the range of 20 to 500 posts (e.g., 20, 25, 30, 35, 40, 45, 50, 100, 200, 300, 400 or 500 posts, inclusive). Furthermore, while FIG. 5 shows the posts 334 extending from the second diaphragm 330 towards the first diaphragm 320, in other embodiments, posts may additionally, or alternatively extend from the first diaphragm 320 towards the second diaphragm 330.

In some embodiments, an anchored post 336 can extend from the first diaphragm 320 towards the second diaphragm 330 through a corresponding aperture 342 of the back plate. The anchored post 336 may extend from an inner rim of the first diaphragm 320 towards the second diaphragm 330. An apex 337 of the anchored post 336 contacts the first diaphragm 320 and is coupled thereto, such that the anchored post 336 is shaped as an inverted truncated cone. In other embodiments, the anchored post may have any other suitable shape, for example, a circular, square or rectangular cross-section, rounded S shaped sidewalls or any other suitable shape. A pierce 324 is defined in the first diaphragm 320, and a through hole 338 is defined through the apex 337. The through hole 338 at least partially overlaps the pierce 324 (e.g., is axially aligned with the pierce 324) and has the same cross-section (e.g., diameter) as the pierce 324. In other embodiments, the through hole 338 may have a cross section which is substantially larger than the cross-section (e.g., diameter) of the pierce 324. The pierce 324 and the through hole 338 allow pressure equalization between a front volume and back volume of the acoustic transducer 310.

A plurality of openings 339 may also be formed in the second diaphragm 330. The plurality of openings 339 can be structured to allow an isotropic etchant (e.g., a wet etchant such as buffered hydrofluoric acid) to flow therethrough to etch and remove portions of the support structure 314 which may be disposed between the first and second diaphragms 320 and 330 during the fabrication process, so as to form the cavity 341. The apertures 342 defined in the back plate 340 also allow the etchant to flow therethrough and etch portions of the support structure 314 that may be positioned between the back plate 340 and the first diaphragm 320. The plurality of openings 339 may then be later sealed, for example, with a low stress silicon nitride (LSN). Such a detailed exemplary embodiment helps to serve to identify where and how purposefully present asymmetries can be present in a pair of transduction elements that are arranged in a stacked configuration, which in turn can affect the relative degree to which the transduction elements can be deflected due to an applied external stimulus, which in turn could benefit from a balance signal produced by a compensation circuit for purposes of producing a more balanced pair of electrical signals in support of a detected stimulus, such as the presence of a pressure wave associated with an acoustic signal.

Figure 6:
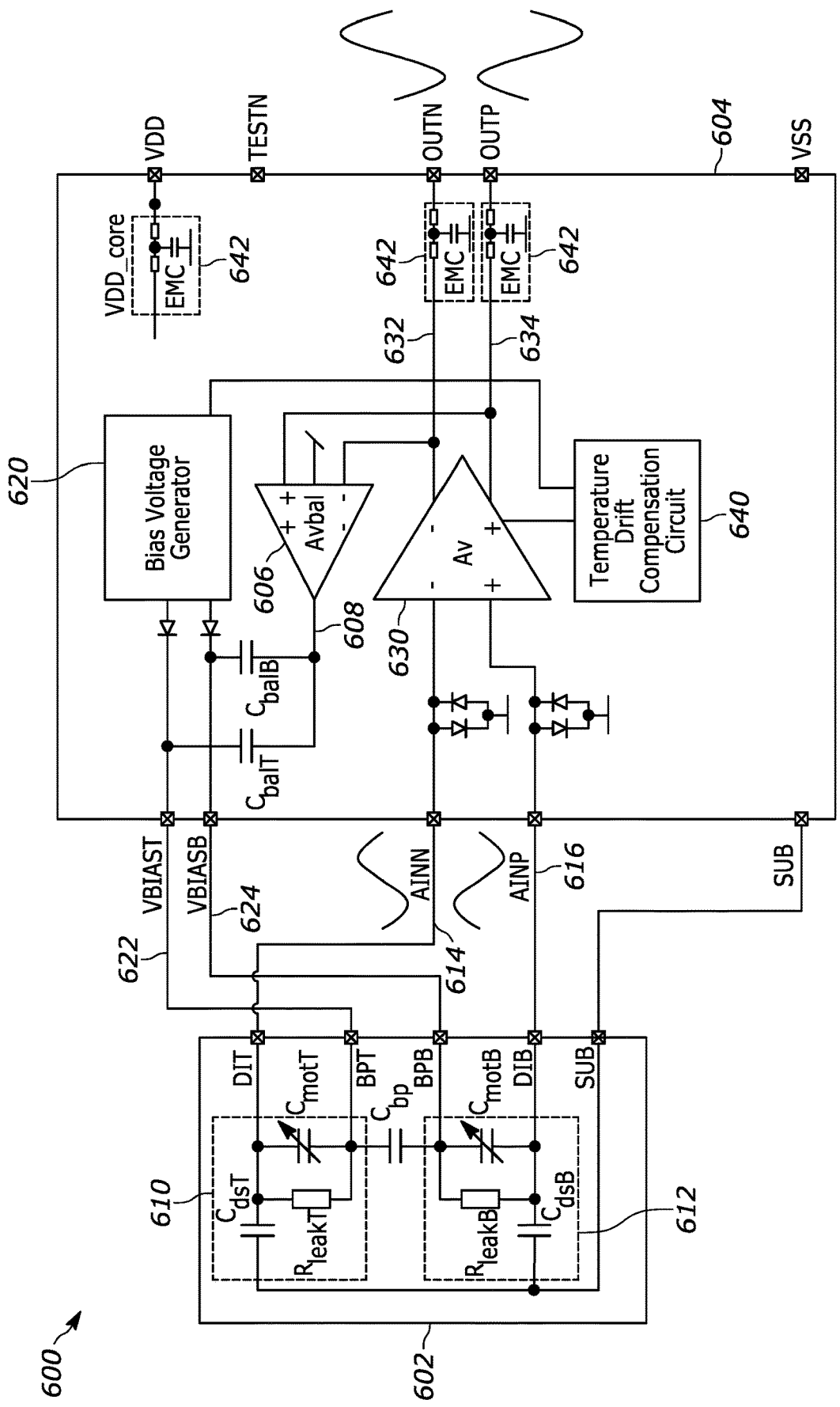
FIG. 6 is a schematic diagram of an exemplary sensor assembly including a differential sensor and an interface circuit, which has a compensation circuit.

FIG. 6 illustrates a schematic diagram of an exemplary sensor assembly 600 including a differential sensor 602 and an interface circuit 604, which has a compensation circuit 606. In the illustrated embodiment, the differential sensor 602 has a pair of transduction elements 610 and 612 organized and arranged for producing first and second electrical signals 614 and 616, which are substantially 180 degrees out of phase and which are each associated with a respective one of a pair of sensor output terminals. The transduction elements 610 and 612 are each coupled to bias voltage generator 620 of the interface circuit 604 for receiving a voltage for initially establishing a charge across each of the respective transduction elements, which has a value that can change dependent upon the degree to which, if any, an external stimulus is detected. For example, each transduction element could be a MEMS device having a corresponding back plate and a corresponding diaphragm, which is sensitive to an acoustic pressure wave, which can cause the diaphragm to be deflected relative to the back plate, thereby causing an associated capacitance value to dynamically change, which is reflected in a relatively fixed charge stored across the MEMS device producing an electronic signal having a varying voltage at a respective one of a pair of output terminal.

Correspondingly, the transduction elements 610 and 612 are shown as a variable capacitors $C_{motT}$ and $C_{motB}$ in parallel with a resistance corresponding to a modeled leakage resistance $R_{leakT}$ and $R_{leakB}$, and a further modeled capacitance $C_{dsT}$ and $C_{dsB}$ between one of the variable capacitor terminals corresponding to the diaphragm for a MEMS device and the substrate. A still further capacitance $C_{bp}$ is illustrated, which is reflective of a capacitance between multiple terminals respectively associated with each of the transduction elements, where each of the multiple terminals are respectively associated with multiple electrically isolated terminals of the back plate that are separately associated with each of the transduction elements 610 and 612.

In the illustrated embodiment, the bias voltage generator 620 can produce a voltage at a desired voltage level to be applied to each of the transduction elements 610 and 612 via a pair of bias output voltage terminals 622 and 624, where a respective one of a pair of DC bias voltages is produced. In at least some instances, a charge pump with a set of selectively switched capacitors under the control of an oscillator and a controller can be used to produce an output voltage from the received first voltage at one or more desired output levels, including levels which may be higher than the voltage level of the initial source. In at least some instances, a sufficiently high bias voltage level may be beneficial in order to allow for a desired degree of sensitivity in the transduction elements. In some instances, the bias voltage generator 620 can provide charge pump programmability to compensate for at least some potentially identified mismatch in the transduction elements 610 and 612, such as a mismatch in gap sensitivity of each diaphragm.

The bias output voltage terminals 622 and 624, are each coupled to a respective one of the pair of transduction elements 610 and 612 of the differential sensor 602. The interface circuit 604 further includes an amplifier circuit 630 having a first input terminal coupled to a first one of the pair of output terminals of the sensor and having a second input terminal coupled to a second one of the pair of output terminals of the sensor. The amplifier circuit 630 produces across a pair of output terminals 632 and 634 a differential output signal. The interface circuit 604 still further includes the compensation circuit 606 coupled to the amplifier circuit 630 for producing a balance signal in the form of a signal 608 associated with a pair of terminals, which are each coupled to a respective one of the bias output voltage terminals 622 and 624, via a corresponding DC blocking capacitor $C_{balT}$ and $C_{balB}$. In the illustrated embodiment, the compensation circuit is coupled to the output terminals of the amplifier circuit 630, where the balance signal is based on the output signal being produced by the amplifier circuit 630, and is intended to dynamically detect any asymmetric output from the amplifier circuit 630, based upon any difference in amplitude in the first and second electrical signals 614 and 616 that are received by the amplifier circuit 630 from the differential sensor 602, and provide a feedback signal via the produced balance signal to equalize sensitivity in both transduction elements 610 and 612. In the particular embodiment illustrated, the compensation circuit 606 is a signal balancing amplifier. In the particular embodiment illustrated, the amplifier circuit 630 is a differential low noise amplifier. In at least some instances, the input stage and gain of the differential low noise amplifier can be adjusted to produce a particular target signal to noise ratio. For example, in at least one implementation involving the detection of an acoustic signal, a signal to noise ratio of approximately 74 dB can be targeted.

In the present embodiment, each one of the pair of transduction elements 610 and 612 has a potential difference in sensitivity to a detected stimulus, which can manifest in the first and second electrical signals 614 and 616 that are being produced by the sensor, which may have a difference in amplitude. In other words, the degree to which each of the MEMS devices will react to the same stimulus can differ due to intentional and/or unintentional differences between the pair of MEMS devices. In at least some instances, it can be beneficial to better balance the performance of the transduction elements, so as to reduce any resulting difference in the amplitude of the respective electrical signals being produced. Such an adjustment may be accomplished through a selective adjustment of the particular value of the bias output voltage being applied to each of the transduction elements 610 and 612.

In the illustrated embodiment, the interface circuit 604 can further include a circuit 640 for acoustic temperature drift compensation, which can produce a control signal that can be used to adjust the gain of the amplifier circuit 630 or the level of the bias voltages VBIAST or VBIASB, respectively. In some instances, at least some of the terminals of the interface circuit 604 can include further line conditioning circuitry 642, such as, for example the output terminals associated with the output of the amplifier circuit 630.

Figure 7:
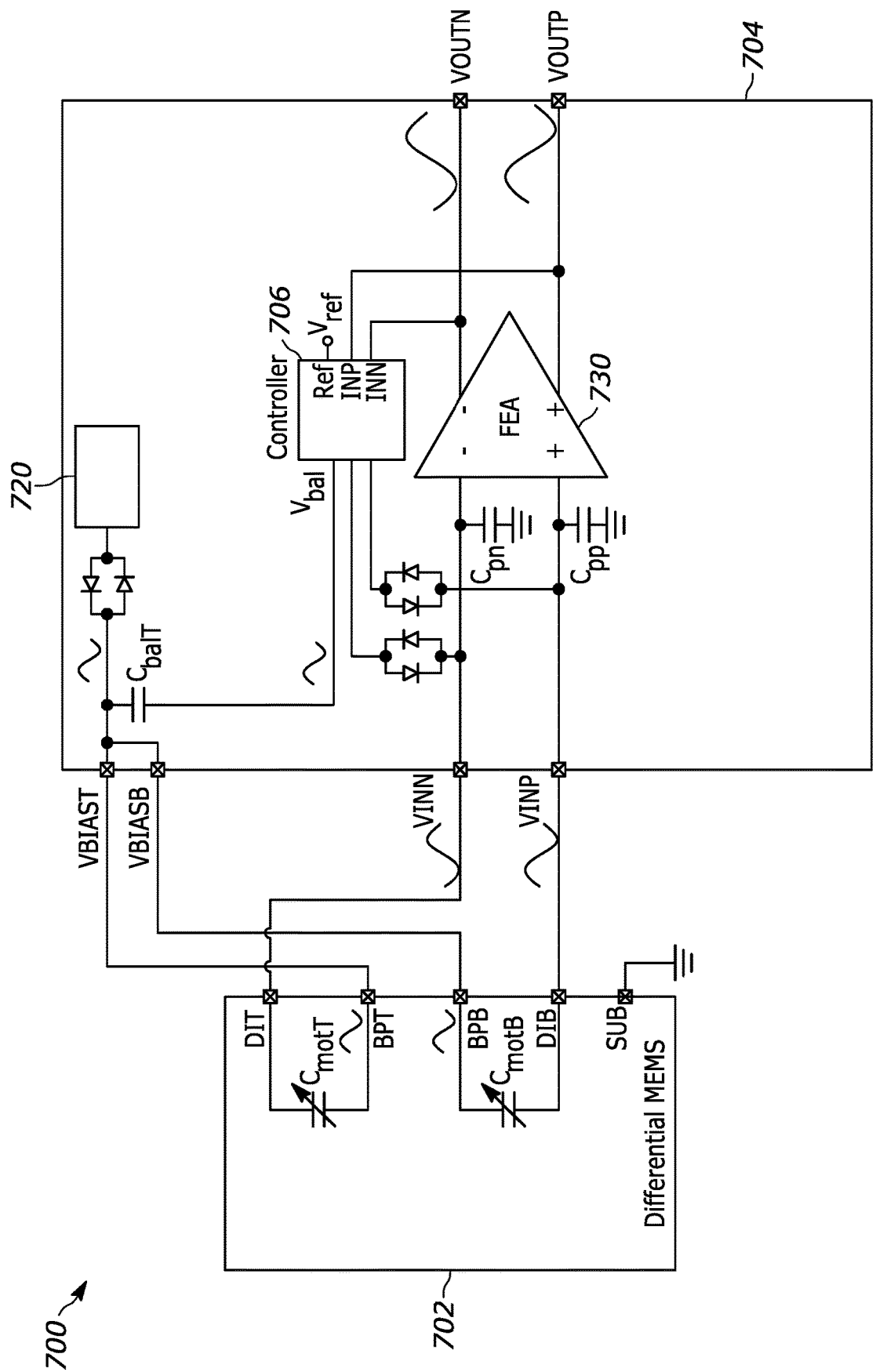
FIG. 7 is a schematic diagram of a further exemplary sensor assembly 700 with a bias voltage generator having a single charge pump.

FIG. 7 illustrates a schematic diagram of a further exemplary sensor assembly 700 with a bias voltage generator having a single charge pump. The exemplary sensor assembly 700, similar to the sensor assembly illustrated in FIG. 6, includes a differential sensor 702 and an interface circuit 704. However, the sensor assembly 700 relative to the sensor assembly 600 has at least a couple of differences. For example the bias voltage generator 720 of the sensor assembly has a single charge pump having a voltage value that is applied to each of the transduction elements of the differential sensor 702. Further, the compensation circuit 706 includes a controller in place of the signal balancing amplifier.

In the illustrated embodiment a pair of MEMS capacitors $C_{motT}$ and $C_{motB}$ of the differential sensor 702 in the form of a differential MEMS transducer are connected between a bias voltage and two amplifier inputs VINN and VINP of an amplifier circuit 730. The bias voltage across the MEMS capacitors in at least some instances, can be in the range of 3-50V (or even higher) depending on the MEMS properties. The MEMS is assembled in a microphone package such that the MEMS capacitors change their values in response to an acoustic pressure—one MEMS capacitor produces an electrical signal that is in phase with the pressure, and the other MEMS capacitor produces an electrical signal that has an opposite phase with respect to the acoustic pressure.

The amplifier inputs of the amplifier circuit 730 can have a relatively high input impedance (>>1 GOhm). The DC operating point of the amplifier inputs can be kept closer to zero volts (0 . . . 2V). When the MEMS capacitors change their value due to an acoustic signal a voltage change can manifest relative to the amplifier inputs VINP and VINN.

Due to potentially not fully symmetric construction and manufacturing tolerances of the MEMS capacitors and the input capacitance of the amplifiers, the signal amplitude at the amplifier input VINP and VINN may not be the same.

The amplitude of the input signals on VINP and VINN can be better balanced by superimposing a signal on the common mode node VBIAST, VBIASB of the two MEMS capacitors. This signal to be respectively superimposed in at least some instances is approximately half of the difference of the two unbalanced input signals. The signal for superimposing can be either in or out of phase with the difference signal depending on which signal has a larger amplitude. The signal can be modulated on the node VBIAST, VBIASB thru the balancing capacitor $C_{balT}$.

In a more general case the modulation signal $V_{bal}$ can be generated by a compensation circuit 706, which includes a regulation controller. In at least some instances, the regulation controller can be a proportional integrating controller. Also, the control signals for the DC input voltages can be generated by the controller block and applied to the input of the amplifier circuit 730 through back-to-back diodes, which can be used to better maintain a higher input impedance.

The controller of the compensation circuit 706 may utilize the difference between the common mode of the differential output signal (or input signal) of the amplifier circuit 730 and a reference signal Vref, or may utilize the differential output signal (or input) of the amplifier circuit 730 as input for the controller. In this way a balancing signal may be applied to adjust the effective sensitivity of each of the MEMS capacitors.

Figure 8:
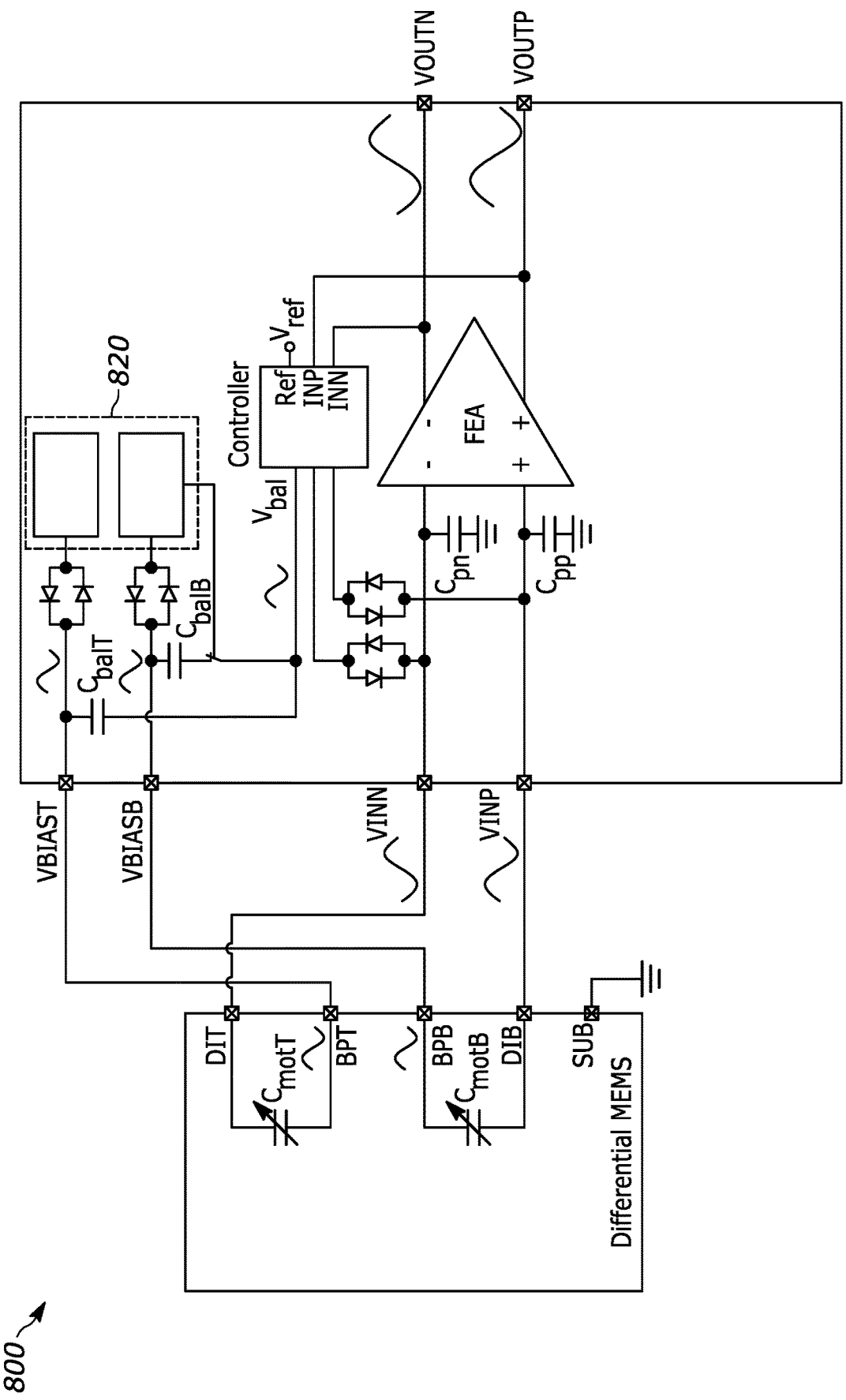
FIG. 8 is a schematic diagram of a further exemplary sensor assembly 800 with a bias voltage generator having a dual charge pump.

FIG. 8 illustrates a schematic diagram of a further exemplary sensor assembly 800 with a bias voltage generator having a dual charge pump. The sensor assembly 800 is similar to the sensor assembly 700 of FIG. 7 with the exception that the bias voltage generator 820 can have two separate charge pumps that are each respectively associated with a corresponding one of the two MEMS capacitors. With the two charge pumps the capacitor gap between the two MEMS capacitors can be made more equal by applying different voltages to the MEMS capacitors through a control of the different output voltage levels being produced by each of the charge pumps.

Figure 9:
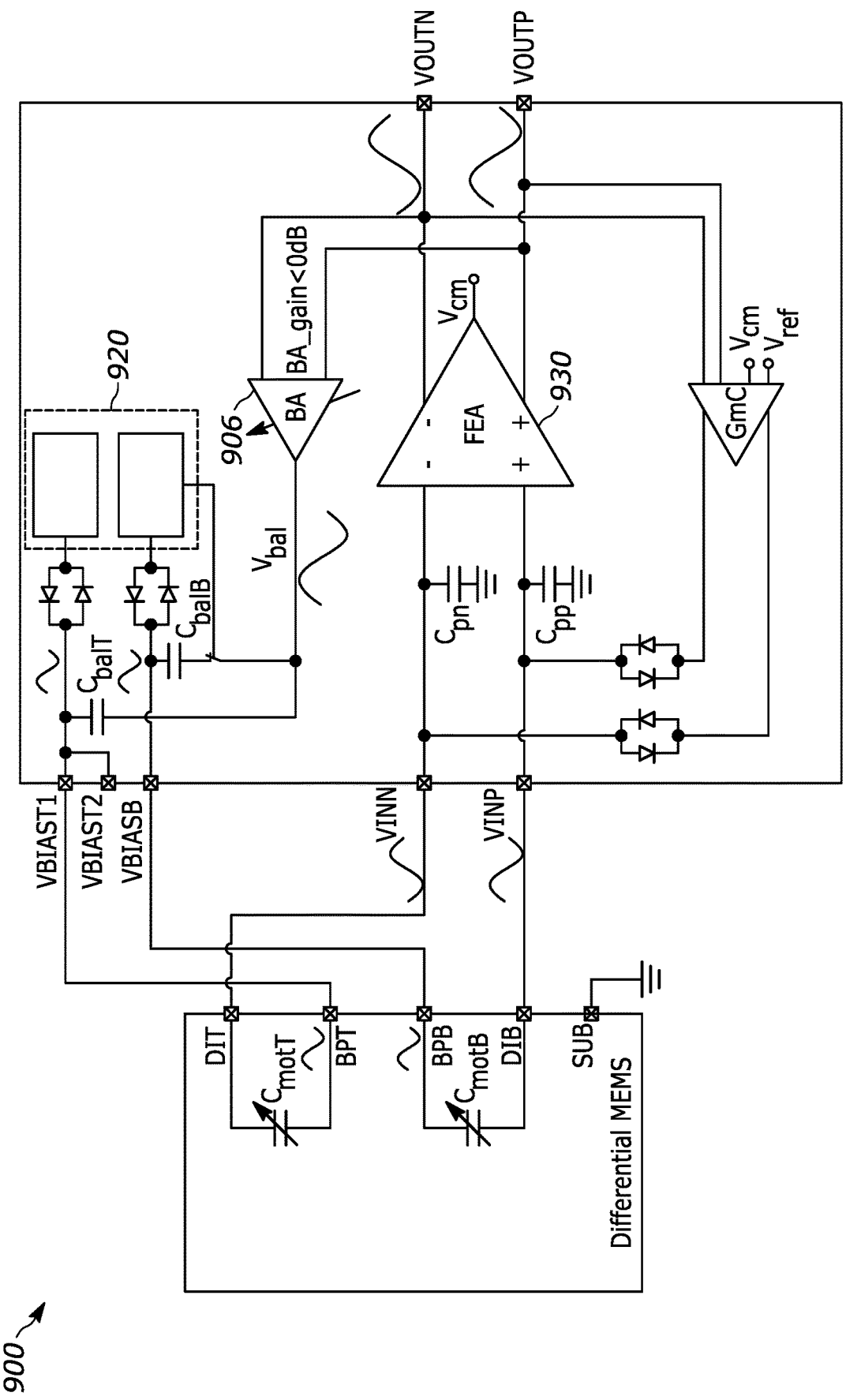
FIG. 9 is a schematic diagram of a further exemplary sensor assembly with calibrated signal balancing.

FIG. 9 illustrates a schematic diagram of a further exemplary sensor assembly 900 with calibrated signal balancing. The present exemplary sensor assembly provides for a balancing amplifier for use as part of the compensation circuit 906. The gain of the balancing amplifier can be set, so that the balancing feedback signal $V_{bal}$ can be a positive or a negative fraction of the differential output signal (or input signal) of the amplifier circuit 930. The loop gain of the balancing loop is generally less than 0 dB. For regulation of the amplifier circuit input DC operating point, a separate gmC loop with differential and common mode regulation can be used. It may be worth further noting, that while the bias voltage generator 920 is shown with two charge pumps more consistent with the bias voltage generator 820 illustrated in FIG. 8, it is also possible that this implementation could also alternatively make use of a single charge pump more consistent with the bias voltage generator 720 illustrated in FIG. 7.

Figure 10:
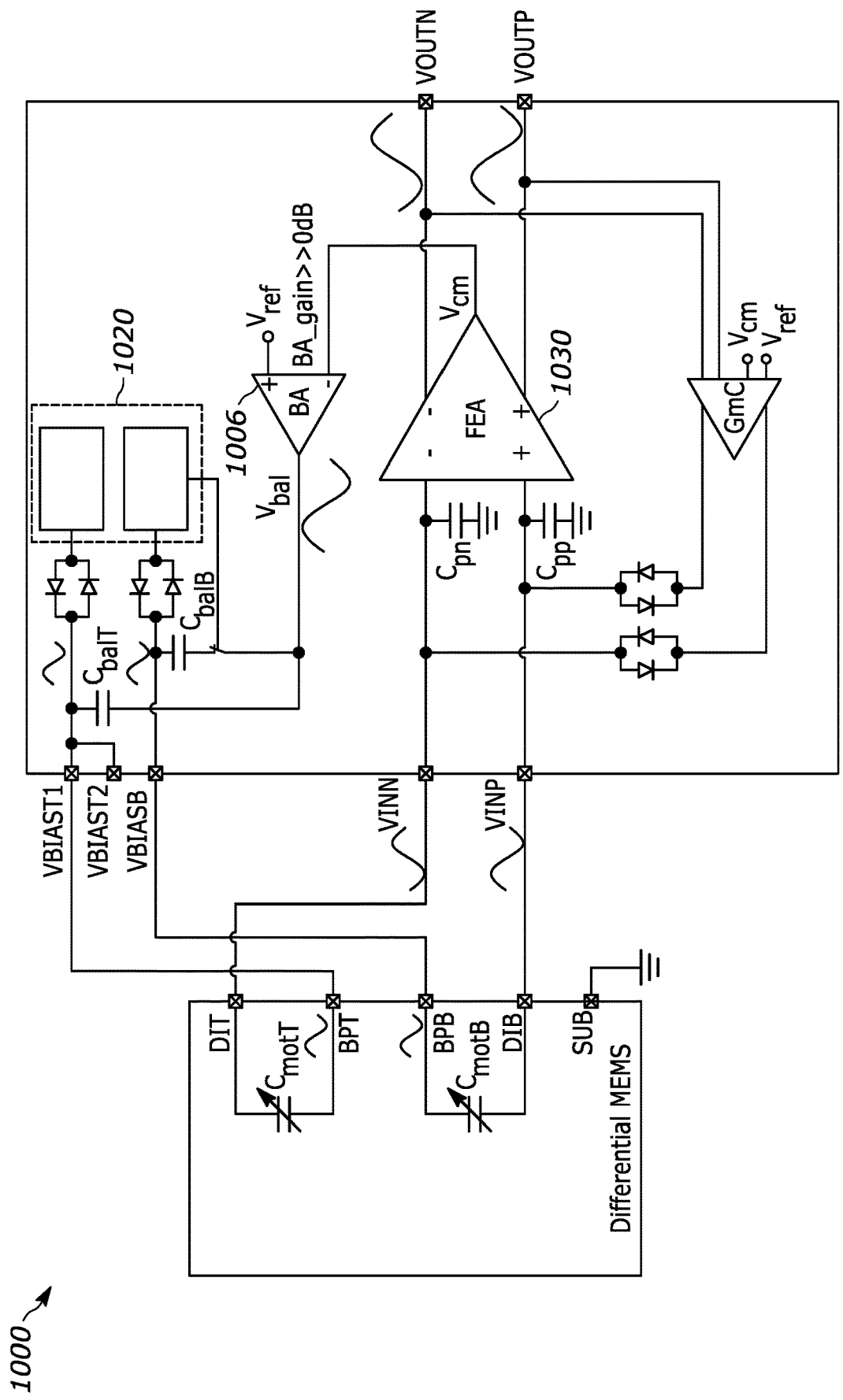
FIG. 10 is a schematic diagram of a further exemplary sensor assembly with regulated signal balancing.

FIG. 10 illustrates a schematic diagram of a further exemplary sensor assembly 1000 with regulated signal balancing. The present exemplary sensor assembly provides for a balancing amplifier for use as part of the compensation circuit 1006. The gain of the balancing amplifier can be set, so that the balancing feedback signal $V_{bal}$ is an amplified difference between the common mode $V_{cm}$ of the differential output signal of the amplifier circuit 1030 and a reference voltage. The loop gain of the balancing loop is generally greater than 0 dB. For regulation of the amplifier circuit input DC operating point, a separate gmC loop with differential and common mode regulation can be used. It again may be worth further noting, that while the bias voltage generator 1020 is shown with two charge pumps more consistent with the bias voltage generator 820 illustrated in FIG. 8, it is also possible that this implementation could similarly also alternatively make use of a single charge pump more consistent with the bias voltage generator 720 illustrated in FIG. 7.

Figure 11:
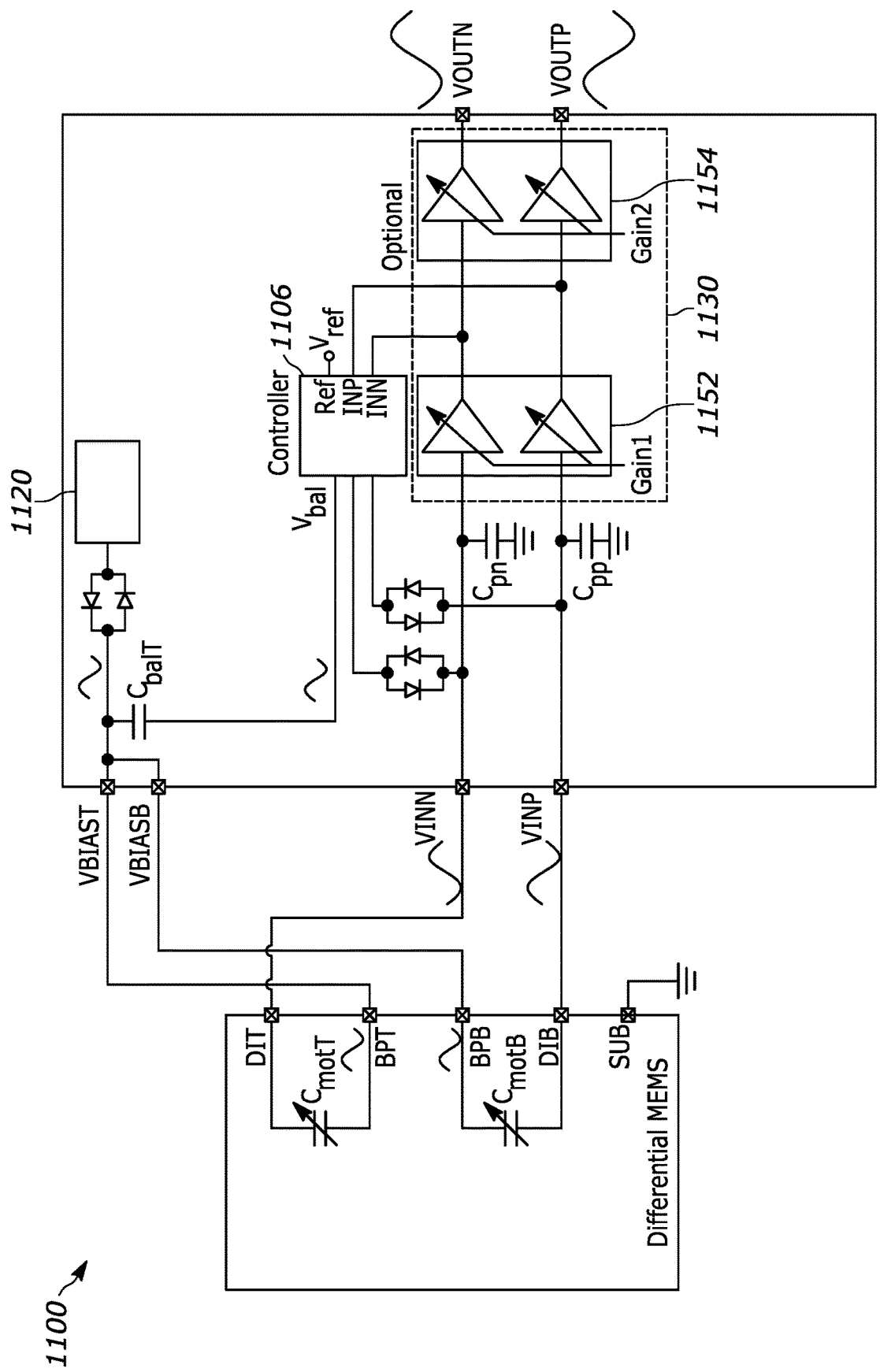
FIG. 11 is a schematic diagram of a further exemplary sensor assembly with an amplifier circuit that includes multiple cascaded amplifier stages.

FIG. 11 illustrates a schematic diagram of a further exemplary sensor assembly 1100 with an amplifier circuit 1130 that includes multiple cascaded amplifier stages 1152 and 1154. Further, as an alternative to using a single difference amplifier, each stage can also make use of two separate single ended amplifiers. The amplifiers associated with each stage could also make use of a different gain. In at least the illustrated embodiment, the input of the compensation circuit 1106 is coupled to the respective outputs of the first of the at least two cascaded amplifier stages. It is also possible that the outputs associated with any one or more of the cascaded amplifier stages could be used by the compensation circuit in generating a corresponding balance signal.

Further, while in some instances the gain of one or more of the stages may be statically set, in other instances the gain of one or more of the stages may be programmable and/or dynamically set. In at least one embodiment, which has a first and a second amplifier stage, the gain of the first stage is set approximately equal to one, and the gain of the second amplifier stage is programmable, where the particular value could be set via a controller. In connection with the present embodiment, the bias voltage generator 1120 could also alternatively make use of one or multiple charge pumps.

Still further, while generally, embodiments involving multiple charge pumps have been shown for generating multiple bias voltages, it is also possible that multiple potentially different bias voltages could be generated using a single charge pump. For example a resistor divider network could be used to generate an intermediate bias voltage value. It is also possible that multiple low dropout regulators could be used to generate different DC bias levels off of a single voltage value, such as one generated by a single charge pump.

Figure 12:
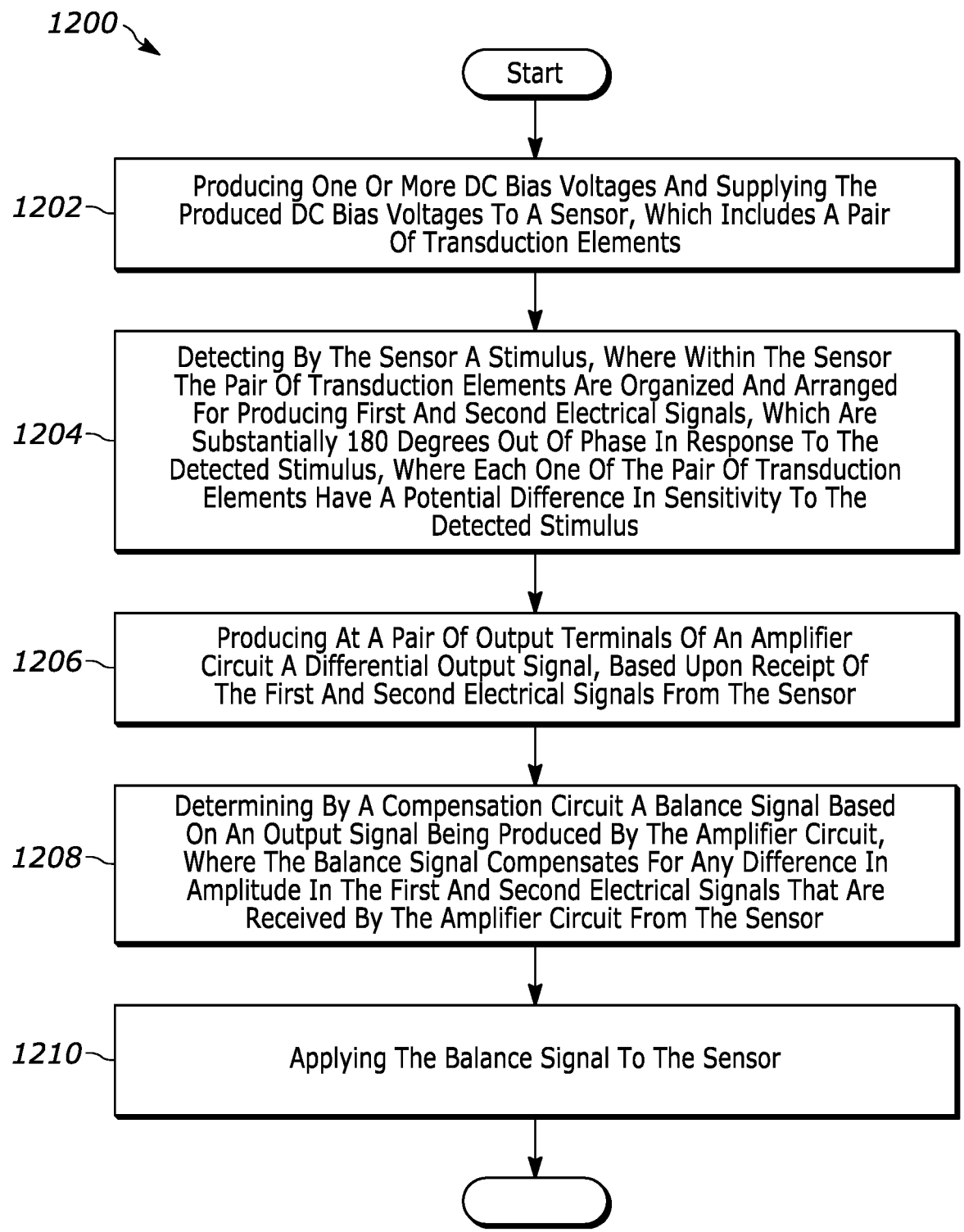
FIG. 12 is a flow diagram of a method of operating a sensor assembly with a compensation circuit for balancing detection sensitivity in producing a differential signal.

FIG. 12 illustrates a flow diagram 1200 of an exemplary method of operating a sensor assembly with a compensation circuit for balancing detection sensitivity in producing a differential signal. The method includes producing 1202 one or more DC bias voltages and supplying the produced DC bias voltages to a sensor, which includes a pair of transduction elements. A stimulus is detected 1204 by the sensor, where within the sensor the pair of transduction elements are organized and arranged for producing first and second electrical signals, which are substantially 180 degrees out of phase in response to the detected stimulus, where each one of the pair of transduction elements have a potential difference in sensitivity to the detected stimulus. A differential output signal is produced 1206 at a pair of output terminals of an amplifier circuit, where the differential output signal is based upon receipt of the first and second electrical signals from the sensor. A balance signal is determined 1208 by a compensation circuit, the balance signal being based on an output signal being produced by the amplifier circuit, where the balance signal compensates for any difference in amplitude in the first and second electrical signals that are received by the amplifier circuit from the sensor. The balance signal is then applied 1210 to the sensor.

In some instances, applying the balance signal to the sensor can include adjusting the values of the respective DC bias voltages that are applied to the sensor.

It should be understood that, notwithstanding the particular steps as shown in the figures, a variety of additional or different steps can be performed depending upon the embodiment, and one or more of the particular steps can be rearranged, repeated or eliminated entirely depending upon the embodiment. Also, some of the steps performed can be repeated on an ongoing or continuous basis simultaneously while other steps are performed. Furthermore, all or portions of different steps can be performed by different elements or by a single element of the disclosed embodiments.

For at least some embodiments, at least some methods or portions thereof in this disclosure can be implemented on or under the control of a programmed processor or controller. However, the controllers, flowcharts, and modules may also be implemented on or under the control of a general purpose or special purpose computer, a programmed microprocessor or microcontroller and peripheral integrated circuit elements, an integrated circuit, a hardware electronic or logic circuit such as a discrete element circuit, a programmable logic device, or the like.

At least some embodiments can improve operation of the disclosed devices. Also, while this disclosure has been described with specific embodiments thereof, it is evident that many alternatives, modifications, and variations will be apparent to those skilled in the art. For example, various components of the embodiments may be interchanged, added, or substituted in the other embodiments. Also, all of the elements of each figure are not necessary for operation of the disclosed embodiments. For example, one of ordinary skill in the art of the disclosed embodiments would be enabled to make and use the teachings of the disclosure by simply employing the elements of the independent claims. Accordingly, embodiments of the disclosure as set forth herein are intended to be illustrative, not limiting. Various changes may be made without departing from the spirit and scope of the disclosure.

In this document, relational terms such as "first," "second," and the like may be used solely to distinguish one entity or action from another entity or action without necessarily requiring or implying any actual such relationship or order between such entities or actions. The phrase "at least one of," "at least one selected from the group of," or "at least one selected from" followed by a list is defined to mean one, some, or all, but not necessarily all of, the elements in the list. The terms "comprises," "comprising," "including," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a," "an," or the like does not, without more constraints, preclude the existence of additional identical elements in the process, method, article, or apparatus that comprises the element. Also, the term "another" is defined as at least a second or more. The terms "including," "having," and the like, as used herein, are defined as "comprising." Furthermore, the background section is written as the inventor's own understanding of the context of some embodiments at the time of filing and includes the inventor's own recognition of any problems with existing technologies and/or problems experienced in the inventor's own work.

What is claimed is:

1. A microphone device comprising:
a sensor having a pair of transduction elements organized and arranged for respectively producing first and second electrical signals, which are substantially 180 degrees out of phase and which are each associated with a respective one of a pair of output terminals, where each one of the pair of transduction elements has a potential difference in sensitivity to a detected stimulus, which can manifest in the first and second electrical signals that are being respectively produced by the pair of transduction elements of the sensor, that have a difference in amplitude; and
an interface circuit including:
a bias voltage generator having one or more bias output voltage terminals, where a respective one of one or more DC bias voltages is produced at each of the bias output voltage terminals, which are coupled to the pair of transduction elements of the sensor;
an amplifier circuit having a first input terminal coupled to a first one of the pair of output terminals of the sensor and having a second input terminal coupled to a second one of the pair of output terminals of the sensor, the amplifier circuit producing at a pair of output terminals a differential output signal; and a compensation circuit coupled to the amplifier circuit for producing a balance signal based on an output signal being produced by the amplifier circuit, wherein the balance signal compensates for any difference in amplitude in the first and second electrical signals that are received by the amplifier circuit from the sensor.

2. The microphone device in accordance with claim 1, wherein the bias voltage generator includes a first charge pump for producing the respective one of the one or more DC bias voltages at a corresponding first one of the one or more bias output voltage terminals, wherein the balance signal is coupled to the corresponding first one of the one or more bias output voltage terminals via a first one of one or more respective DC blocking capacitors.

3. The microphone device in accordance with claim 2, wherein the bias voltage generator includes a second charge pump for producing the respective one of the one or more DC bias voltages at a corresponding second one of the one or more bias output voltage terminals, wherein the balance signal is coupled to each of the corresponding first one and the second one of one or more bias output voltage terminals via respective ones of the one or more respective DC blocking capacitors.

4. The microphone device in accordance with claim 1, wherein the compensation circuit includes a signal balancing amplifier, which is adapted to dynamically detect an asymmetric output included as part of the differential output signal produced by the amplifier circuit and provide a feedback signal, included as part of the balance signal produced by the compensation circuit, to equalize sensitivity in each of the first and second electrical signals produced by the sensor.

5. The microphone device in accordance with claim 1, wherein the pair of transduction elements are associated with a back plate having multiple bias voltage terminals for supporting the coupling of multiple independent bias voltages.

6. An interface circuit for interfacing with a sensor having a pair of transduction elements organized and arranged for respectively producing first and second electrical signals, which are substantially 180 degrees out of phase and which are each associated with a respective one of a pair of output terminals, where each one of the pair of transduction elements has a potential difference in sensitivity to a detected stimulus, which can manifest in the first and second electrical signals that are being respectively produced by the pair of transduction elements of the sensor, that have a difference in amplitude, the interface circuit comprising:

a bias voltage generator having one or more bias output voltage terminals, where a respective one of one or more DC bias voltages is produced at each of the bias output voltage terminals, which are adapted to be coupled to the pair of transduction elements of the sensor;

an amplifier circuit having a first input terminal adapted to be coupled to a first one of the pair of output terminals of the sensor and having a second input terminal adapted to be coupled to a second one of the pair of output terminals of the sensor, the amplifier circuit producing at a pair of output terminals a differential output signal; and a compensation circuit coupled to the amplifier circuit for producing a balance signal based on an output signal being produced by the amplifier circuit, wherein the balance signal compensates for any difference in amplitude in the first and second electrical signals that are adapted to be received by the amplifier circuit from the sensor.

7. The interface circuit in accordance with claim 6, wherein the bias voltage generator includes a first charge pump for producing the respective one of the one or more DC bias voltages at a corresponding first one of the one or more bias output voltage terminals, wherein the balance signal is coupled to the corresponding first one of the one or more bias output voltage terminals via a first one of one or more respective DC blocking capacitors.

8. The interface circuit in accordance with claim 7, wherein the charge pump includes one or more control signals, which are based on the balance signal produced by the compensation circuit for adjusting the operation of the charge pump to compensate for any detected difference in amplitude in the first and second electrical signals that are adapted to be received by the amplifier circuit from the sensor, that is associated with a mismatch in sensitivity to a detected stimulus by the sensor.

9. The interface circuit in accordance with claim 7, wherein the bias voltage generator includes a second charge pump for producing the respective one of the one or more DC bias voltages at a corresponding second one of the one or more bias output voltage terminals, wherein the balance signal is a differential signal associated with a pair of terminals respectively coupled to each of the corresponding first one and the second one of one or more bias output voltage terminals via respective ones of the one or more respective DC blocking capacitors.

10. The interface circuit in accordance with claim 6, wherein the output signal upon which the balance signal is based includes the differential output signal produced by the amplifier circuit.

11. The interface circuit in accordance with claim 6, wherein the output signal upon which the balance signal is based includes a common mode output of the amplifier circuit.

12. The interface circuit in accordance with claim 6, wherein the compensation circuit includes a signal balancing amplifier, which is adapted to dynamically detect an asymmetric output included as part of the differential output signal produced by the amplifier circuit and provide a feedback signal, included as part of the balance signal produced by the compensation circuit, to equalize sensitivity in each of the first and second electrical signals adapted to be produced by the sensor.

13. The interface circuit in accordance with claim 6, wherein the compensation circuit includes a proportional integrating controller having an input coupled to the differential output signal produced by the amplifier circuit.

14. The interface circuit in accordance with claim 6, wherein the balance signal produced by the compensation circuit is based upon a detected common mode shift of the differential output signal produced by the amplifier circuit.

15. The interface circuit in accordance with claim 6, wherein the interface circuit is included as part of a microphone device including a housing, where the microphone device further includes the sensor having the pair of transduction elements disposed in the housing.

16. The interface circuit in accordance with claim 15, wherein the housing of the microphone device includes a base, a cover, and a port in one of the base or cover, through which the stimulus detected by the pair of transduction elements of the sensor can be received.

17. The interface circuit in accordance with claim 15, wherein the pair of transduction elements of the sensor are included as part of a differential microelectromechanical systems (MEMS) motor.

18. The interface circuit in accordance with claim 17, wherein the differential microelectromechanical systems motor is an integrated dual-diaphragm microelectromechanical systems motor with separate back plates, each back plate having a separate respective one of multiple bias voltage terminals for supporting the coupling of multiple independent bias voltages included as part of the one or more DC bias voltages.

19. The interface circuit in accordance with claim 17, wherein the differential microelectromechanical systems motor is an integrated dual-diaphragm microelectromechanical systems motor with a post protruding from a first one of the dual-diaphragms, wherein a gap separates a tip of the post from a second one of the dual-diaphragms, which is different than the first one.

20. The interface circuit in accordance with claim 6, wherein at least one of the DC bias voltages produced by the bias voltage generator has a respective value which is programmable.

21. The interface circuit in accordance with claim 6, wherein the amplifier circuit includes at least a first amplifier stage and a second amplifier stage coupled in series, where the output of the first amplifier stage is coupled to the input of the second amplifier stage at respective intermediate nodes associated with an intermediate differential signal, and where the compensation circuit is coupled to the respective intermediate nodes of the amplifier circuit for receiving the intermediate differential signal, as part of producing the balance signal.

22. A method comprising:

producing one or more DC bias voltages and supplying the produced DC bias voltages to a sensor, which includes a pair of transduction elements;

detecting by the sensor a stimulus, where within the sensor the pair of transduction elements are organized and arranged for respectively producing first and second electrical signals, which are substantially 180 degrees out of phase in response to the detected stimulus, where each one of the pair of transduction elements have a potential difference in sensitivity to the detected stimulus, which can manifest in the first and second electrical signals that are being respectively produced by the pair of transduction elements of the sensor, that have a difference in amplitude;

producing at a pair of output terminals of an amplifier circuit a differential output signal, based upon receipt of the first and second electrical signals from the sensor;

determining by a compensation circuit a balance signal based on an output signal being produced by the amplifier circuit, where the balance signal compensates for any difference in amplitude in the first and second electrical signals that are received by the amplifier circuit from the sensor; and applying the balance signal to the sensor.

23. The method in accordance to claim 22, wherein applying the balance signal to the sensor includes adjusting the values of the respective DC bias voltages that are applied to the sensor.

* * * * *